United States Patent
Tanaka

(10) Patent No.: US 6,411,558 B1
(45) Date of Patent: Jun. 25, 2002

(54) SEMICONDUCTOR DEVICE FOR COMPENSATING A FAILURE THEREIN

(75) Inventor: Shigenobu Tanaka, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/466,399

(22) Filed: Dec. 17, 1999

(30) Foreign Application Priority Data

Dec. 17, 1998 (JP) .............................. 10-359798

(51) Int. Cl.$^7$ ................................................ G11C 7/00
(52) U.S. Cl. ......................................... 365/201; 365/200
(58) Field of Search ............................... 365/201, 200; 714/21.1, 710, 711, 733

(56) References Cited

U.S. PATENT DOCUMENTS

| | | | | |
|---|---|---|---|---|
| 5,467,457 A | * | 11/1995 | Kohda | 365/200 |
| 5,502,676 A | * | 3/1996 | Pelley | 365/200 |
| 5,758,056 A | * | 5/1998 | Barr | 395/182.05 |
| 6,011,734 A | * | 1/2000 | Pappert | 365/200 |

FOREIGN PATENT DOCUMENTS

| | | |
|---|---|---|
| JP | 50-150329 | 12/1975 |
| JP | 56-19598 | 2/1981 |
| JP | 63-261434 | 10/1988 |
| JP | 63-305444 | 12/1988 |
| JP | 3-147162 | 6/1991 |
| JP | 4-106647 | 4/1992 |
| JP | 4-312148 | 11/1992 |
| JP | 5-189327 | 7/1993 |
| JP | 6-139152 | 5/1994 |
| JP | 11-53269 | 2/1999 |

\* cited by examiner

Primary Examiner—A. Zarabian
(74) Attorney, Agent, or Firm—Dickstein, Shapiro, Morin & Oshinsky, LLP.

(57) ABSTRACT

The semiconductor device of the present invention includes a failure diagnostic device for diagnosing a memory to detect a failed address; and a failed bit compensation device for compensating a failed bit in the memory which is specified by the failed address, based on the diagnostic result by the failure diagnostic device. The failure diagnostic device diagnoses the memory within the address area for specified data to be stored in the memory. The failure diagnostic device diagnoses the memory outside the address area for storing the data, and detects a normal address, and the failed bit compensation device substitutes the failed address for the normal address.

14 Claims, 6 Drawing Sheets

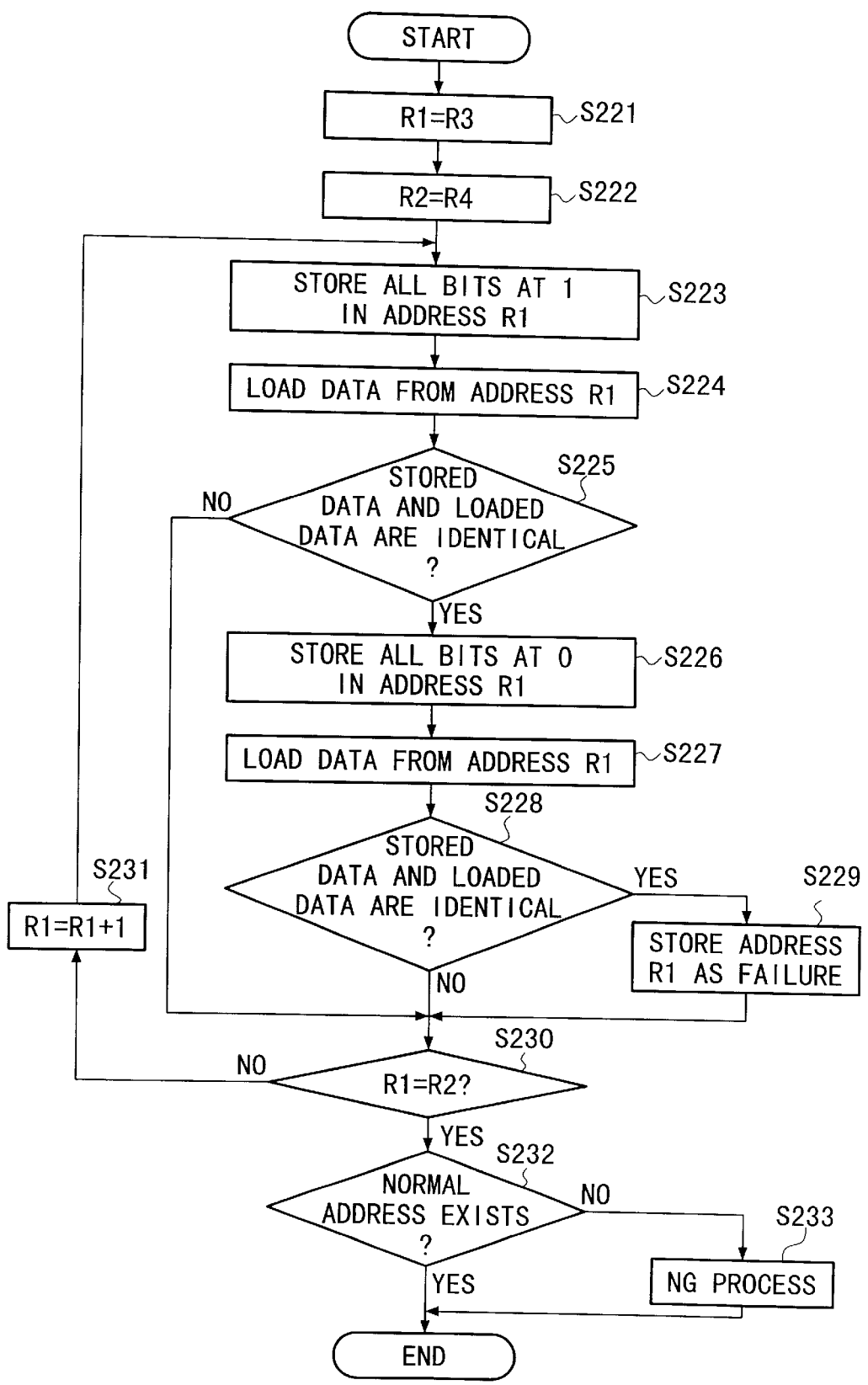

SEMICONDUCTOR DEVICE FOR COMPENSATING A FAILURE THEREIN

BACKGROUND OF THE INVENTION

1. Field of the Invention

The present invention relates to a process for compensating a failure in a semiconductor device such as a microcomputer with a memory, and in particular, to a device for compensating a failure in a memory.

This application is based on Japanese Patent Application No. Hei 10-359798, the contents of which are incorporated herein by reference.

2. Description of the Related Art

Semiconductor devices such as microcomputers and DSPs (digital signal processors), in general, include memories such as RAMs and ROMs. As fine manufacturing technology has developed in recent years, integration of semiconductor devices has progressed remarkably, increasing the storage capacities of the memories built in the semiconductor devices.

As fine manufacturing technology has progressed, defects have tended to occur due to dust produced in the manufacturing process, and therefore the yield may be decreased. Particularly, because a mass storage memory includes a number of integrated memory cells, failed bits may frequently occur. Fine manufacturing processes may have a greater effect on the yield of memory cells than the yield of logic circuit portions. The failed bits in microcomputers with mass storage memory must be compensated.

Conventional general mass storage memories include a redundancy circuit which compensates the failed bits. This redundancy circuit includes spare columns and rows in the memory cell array, programs the failed address in a fuse circuit in advance, and selects the specified spare column or row when the address from external devices coincides with the failed address.

The disadvantage of conventional redundancy circuits is that they increase the manufacturing costs. Specifically, because the redundancy circuit is built in the memory, the number of elements and the scale of the circuitry of the memory are increased, resulting in an increased area for the memory. Further, an additional process is required to form the fuse elements in the fuse circuit. Moreover, a test process for specifying the address of failed bits, and a process for cutting the fuse are required. As the result, the costs of compensating the failure are increased. To store the failed address in the fuse circuit, the fuse elements must be trimmed by laser, which may cause damages on the surface of the chip, degrading the quality of the device.

Another problem of conventional redundancy circuits is that the compensation of failures is inefficient. Specifically, because the redundancy circuit substitutes the failed bits for the spare columns or rows, the failure over the entire column or row can be efficiently compensated. The efficiency of the compensation, however, may become poor when compensating a small number of failed bits or dispersed failed bits, that is, the conventional redundancy circuit cannot sufficiently cope with occurrences of various failed bits. When compensating a small number of failed bits, the ratio of the failed bits to the bits in the spare columns or rows becomes comparatively high, reducing the efficiency in the use of the spare bits (redundancy bits). Moreover, because the conventional redundancy circuit is intended to compensate all bits, the compensation of the failure is not completed unless all bits are substituted, even when a failed bit exists in an address area which is not actually used.

BRIEF SUMMARY OF THE INVENTION

It is therefore an object of the present invention to provide a semiconductor device and a method which can efficiently compensate various failures without increasing the costs.

In one aspect of the present invention, the semiconductor device with a memory, comprises: a failure diagnostic device for diagnosing the memory to detect a failed address; and a failed bit compensation device for compensating a failed bit in the memory which is specified by the failed address, based on the diagnostic result by the failure diagnostic device.

According to the semiconductor device of the present invention, the failure diagnostic device diagnoses the built-in memory to detect the address of the failed bit in the memory. The failed bit compensation device compensates the failed bit. Thus, the present invention performs the self-diagnostic process for the memory, and compensates the failed bit, eliminating the failure compensation step from the manufacturing process. Because the failed bits specified by the failed address are individually compensated, the present invention can cope with various failures efficiently.

The failure diagnostic device diagnoses the memory within the address area for specified data (e.g., application program) to be stored in the memory. The address area in which data is not stored is excluded from the target of the diagnostic process, and the load of the failure diagnostic process can be decreased.

The failure diagnostic device diagnoses the memory using specified data to be stored in the memory.

Even when a failure exists, the failure is not detected as long as it does not hinder specified data from being stored. The target is limited to the minimum range in the memory required to store the specified data, thus minimizing the diagnostic process.

The failure diagnostic device diagnoses the memory outside the address area for specified data to be stored in the memory, and detects a normal (defect-free) address, and the failed bit compensation device substitutes the failed address for the normal address.

The failed address is substituted for the normal spare address, that is, the failed bit is substituted for the normal bit in the free storage area in the memory. Therefore, the efficiency in the use of the bits in the memory is improved, and the scale of circuitry for the compensation of the failure is reduced.

The failed bit compensation device comprises: a register group for substituting the failed bit; a failed address storage device for storing the failed address detected by the failure diagnostic device; an address coincidence detection device for detecting the coincidence between the failed address stored in the failed address storage device and the address sent to the memory; and a selector for selecting one of the memory and the register group to a data bus, based on the detection result by the address coincidence detection device.

The address coincidence detection device compares the address sent to the memory with the failed address stored in the failed address storage device, and detects the coincidence. Based on this detection, one of the memory and the register group is selected and is connected to the data bus. When the failed address is accessed, the failed address is substituted for the register group, to thereby compensate the failure in the memory. Further, the failed bit compensation device replaces the failed bit, specified by the failed address, with one of registers in the register group on a bit basis.

The method for compensating a failure in a semiconductor device with a memory, comprises the steps of: failure diagnostic step of diagnosing the memory to detect a failed address; and failed bit compensation step of compensating a failed bit in the memory which is specified by the failed address, based on the diagnostic result in failure diagnostic step.

According to the method of the present invention, the failure diagnostic device diagnoses the built-in memory to detect the address of the failed bit in the memory. The failed bit compensation device compensates the failed bit. Thus, the present invention performs the self-diagnostic process for the memory, and compensates the failed bit, eliminating failure compensation step from the manufacturing process. Because the failed bits specified by the failed address are individually compensated, the present invention can cope with various failures efficiently.

In the failure diagnostic step, the diagnosis of the memory is made within the address area for specified data to be stored in the memory. The address area in which data is not stored is excluded from the target of the diagnostic process, and the load of the failure diagnostic process can be decreased.

In the failure diagnostic step, the diagnosis of the memory is made using specified data to be stored in the memory.

Even when a failure exists, the failure is not detected as long as it does not hinder specified data from being stored. The target is limited to the minimum range in the memory required to store the specified data, thus minimizing the diagnostic process.

In the failure diagnostic step, the diagnosis of the memory is made outside the address area for specified data, which is to be stored in the memory, to detect a normal (defect-free) address. In the failed bit compensation step, the failed address is substituted for the normal address. Therefore, the efficiency in the use of the bits in the memory is improved.

The failed bit compensation step comprises the steps of: a) storing the failed address detected in failure diagnostic step; b) detecting the coincidence between the failed address and the address sent to the memory; and c) selecting one of the memory and the register group to a data bus when the coincidence between the failed address and the address sent to the memory is detected.

The address sent to the memory is compared with the failed address stored in the failed address storage device, and detects the coincidence. Based on this detection, one of the memory and the register group is selected and is connected to the data bus. When the failed address is accessed, the failed address is substituted for the register group, to thereby compensate the failure in the memory. The failed bit compensation device replaces the failed bit, specified by the failed address, with one of registers in the register group on a bit basis.

BRIEF DESCRIPTION OF THE DRAWINGS

FIG. 6 is a flow chart showing the operation of the semiconductor device of the fourth embodiment of the present invention.

DETAILED DESCRIPTION OF THE INVENTION

The semiconductor device and the method for compensating a failure (defect) in the device, according to an embodiment of the present invention, will be explained.

Embodiment 1

Figure 1:
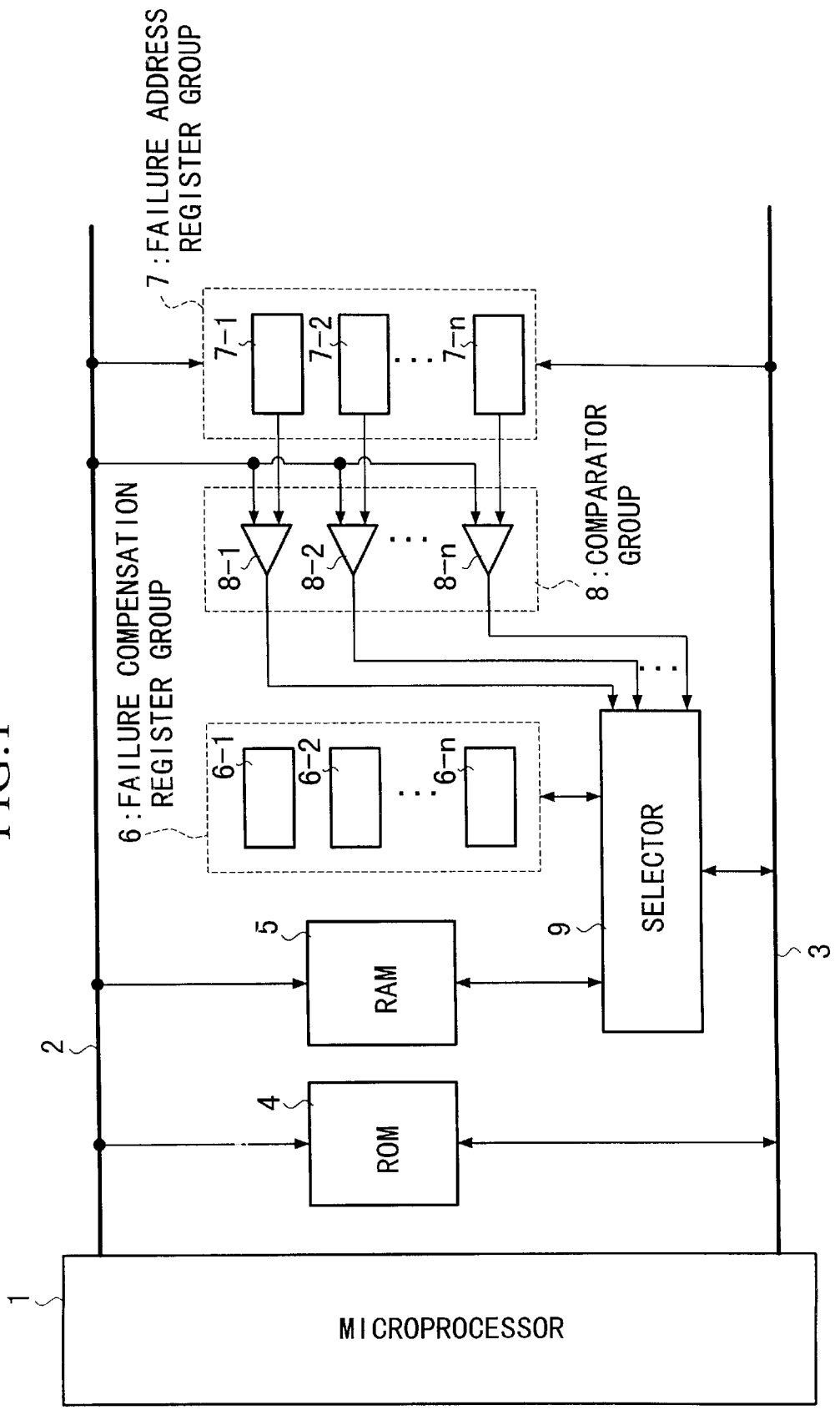
FIG. 1 is a block diagram showing the semiconductor device according to the first to third embodiments of the present invention.

FIG. 1 shows the semiconductor device of the first embodiment.

The first embodiment is a micro computer which comprises: a microprocessor 1 for executing various processes; a ROM (read only memory) 4 which is a non-volatile memory for storing various executable programs; a RAM (random access memory) 5 for storing application programs; and a failure compensation circuit described below.

In this embodiment, the target of the compensation is a failure in the RAM 5.

The failure compensation circuit includes: the function of the microprocessor 1; a failure compensation register group 6 for compensating a failure by replacing a failed bit; a failed address register group 7 for storing failed addresses; a comparator group 8 for comparing the failed address with the address given by the RAM 5 and detecting consistency therebetween; and a selector circuit 9 for selecting the failure compensation register group 6 instead of the RAM 5 and connecting the selected register group 6 to a data bus 3.

The microprocessor 1 is connected to the ROM 4, the RAM 5, and the circuit blocks of the failure compensation circuit via an address bus 2 and the data bus 3. In the first embodiment, the RAM 5 stores 8 bit data in one address, and performs store (write) and load (read) operations on a per 8 bit basis. The ROM 4 stores a failure detecting program for diagnostically judging the failure in the RAM 5. The functions of the microprocessor 1 for compensating the failure are initiated by starting the failure detecting program.

The failure compensation register group 6 includes n registers (n: natural number) 6-1 to 6-n. Each register stores data (8 bit data) corresponding to the data length in the RAM 5. Also, the failed address register group 7 includes n registers 7-1 to 7-n which can store an address given from the microprocessor 1 in the RAM 5. The registers 6-1 to 6-n in the failure compensation register group 6 are associated with the register 7-1 to 7-n in the failed address register group 7, respectively.

The data in the registers 7-1 to 7-n in the failed address register group 7 are sent to comparators 8-1 to 8-n in the comparator group 8, and are compared with the addresses given from the microprocessor 1 to the RAM 5. The output signals from the comparator group 8 are sent to the selector circuit 9.

Figure 2:
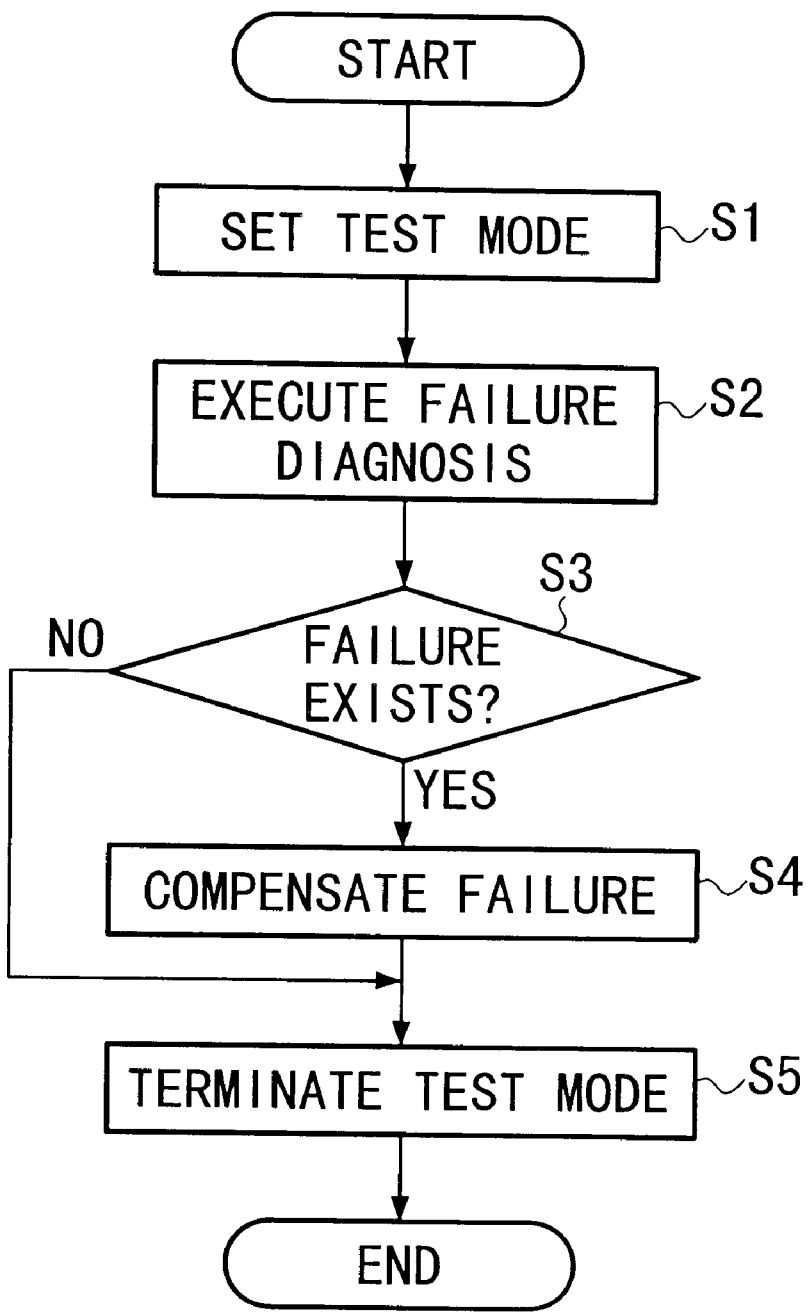
FIG. 2 is a flow chart showing the operation of the semiconductor device of the first embodiment of the present invention.

In the following, the operation of compensating the failure by the semiconductor device will be explained with reference to the flow chart of FIG. 2.

In step S1, in response to the input of an external reset signal (not shown), the status of the failure compensation circuit enters a test mode. In the test mode, the selector circuit 9 is initialized and selects the RAM 5, and data in the registers in the failure compensation register group 6 and in the failed address register group 7 are cleared.

In step S2, the microprocessor 1 starts the failure detecting program stored in the ROM 4, and executes the failure diagnostic process for the entire address area in the RAM 5. Specifically, the microprocessor 1 successively sends the addresses from the top to the last address to the RAM 5 through the address bus 2, and stores (writes) specified data in the RAM 5 through the data bus 3. Then, the microprocessor 1 loads (reads) the data from the RAM 5, and determines on an address basis whether the stored data and the loaded data are identical or not, to thereby detect a failed address. The detected failed addresses are successively stored in the registers 7-1 to 7-n which are mapped to the specified addresses.

In step S3, the microprocessor 1 determines the presence or absence of the failures detected in the above failure diagnostic process, and performs the failure compensation process described below.

In step S4, when a failure occurred (step S3: YES), the microprocessor 1 sets the failure compensation circuit to the active state, and performs the failure compensation process for compensating the detected failure as described later. When a failure does not occur (step S3: NO), step S4 is skipped, and the flow proceeds to step S5.

In step S5, after the execution of the above steps, the microprocessor 1 finally terminates the test mode, and enter the normal state.

Thus, when there is a failed bit in the RAM 5, the failed address register group 7 stores the failed address of the RAM 5, and the failure compensation circuit becomes active. Then, the selector 9 is initialized so as to select the RAM 5. When there is no failed bit, the failure compensation circuit becomes inactive, the selector circuit 9 is fixed to continuously select the RAM 5.

The normal operation when the failure compensation circuit is active, i.e., when the microprocessor 1 accesses the RAM 5, will now be explained. The microprocessor 1 loads the application program (specified data) from an external device and stores it in the RAM 5. Then, the microprocessor 1 sends the address to the RAM 5 through the address bus 2, and sends the data of the application program to the RAM 5 through the data bus 3 and the selector circuit 9.

When the address sent from the microprocessor 1 to the RAM 5 corresponds to the failed address stored in, for example, the register 7-1 in the failed address register group 7, the comparator 8-1 outputs a signal indicating coincidence. On reception of this signal, the selector circuit 9 connects the register 6-1 (corresponding to the register 7-1) in the failure compensation register group 6 to the data bus 3.

Thus, the data area (including the failed bit) in the RAM 5, which is specified by the failed address stored in the register 7-1, is substituted for the register 6-1. Therefore, the register 6-1 is accessed by the microprocessor 1. The. data, which is to be stored in the data area in the RAM 5 specified by the failed address, is actually stored in the register 6-1.

When the address which is sent from the microprocessor 1 to the RAM 5 is not identical to any one of the failed addresses stored in the failed address register group 7, the failed address is not detected, and the comparator group 8 does not output the signal indicating coincidence. Therefore, the RAM 5 is connected to the data bus 3 through the selector circuit 9, and is accessed by the microprocessor 1.

Whenever a failed address is detected, the data area in the RAM 5, which is specified by the failed address, is replaced with the register in the failure compensation register group 6 corresponding to the register in the failed address register group 7 which stores the failed address.

According to the above process, while the failed bit specified by the failed address is substituted for the register in the failure compensation register group 6, the application program is stored in the RAM 5.

When starting the application program stored in the RAM 5, the microprocessor 1 successively sends the addresses to the RAM 5 through the address bus 2, and reads the data corresponding to the addresses through the data bus 3.

When the address, which is sent from the microprocessor 1 to the RAM 5, is identical to the failed address stored in, for example, the register 7-1 in the failed address register group 7, the comparator 8-1 outputs the signal indicating the coincidence. On reception of this signal, the selector circuit 9 selects the register 6-1 in the failure compensation register group 6, and connects it to the data bus 3. That is, instead of the data area (including the failed bit) in the RAM 5, which is specified by the failed address stored in the register 7-1, the register 6-1 is read out.

When the address, which is sent from the microprocessor 1 to the RAM 5, is not identical to the failed address stored in the failed address register group 7, the comparator group 8 does not output the signal indicating coincidence. Therefore, the RAM 5 is connected to the data bus 3 through the selector circuit 9, and is accessed by the microprocessor 1.

Thus, the data corresponding to the failed address in the RAM 5 is read from the register in the failure compensation register group 6.

According to the first embodiment, the presence or absence of the failure is judged within the semiconductor device, and the failure can be compensated.

Embodiment 2

The second embodiment of the present invention will now be explained. While in the first embodiment the failure diagnostic process is carried out for the entire address area in the RAM 5, the semiconductor device of the second embodiment specifies the address area in the RAM 5, in which the application program (or specified data) is to be stored, as the target of the failure diagnostic process, thereby reducing the load due to the failure diagnostic process. The semiconductor device of the second embodiment employs the structure shown in FIG. 1, and the microprocessor 1 performs the process shown in FIG. 3 corresponding to step S2 in FIG. 2.

Figure 3:
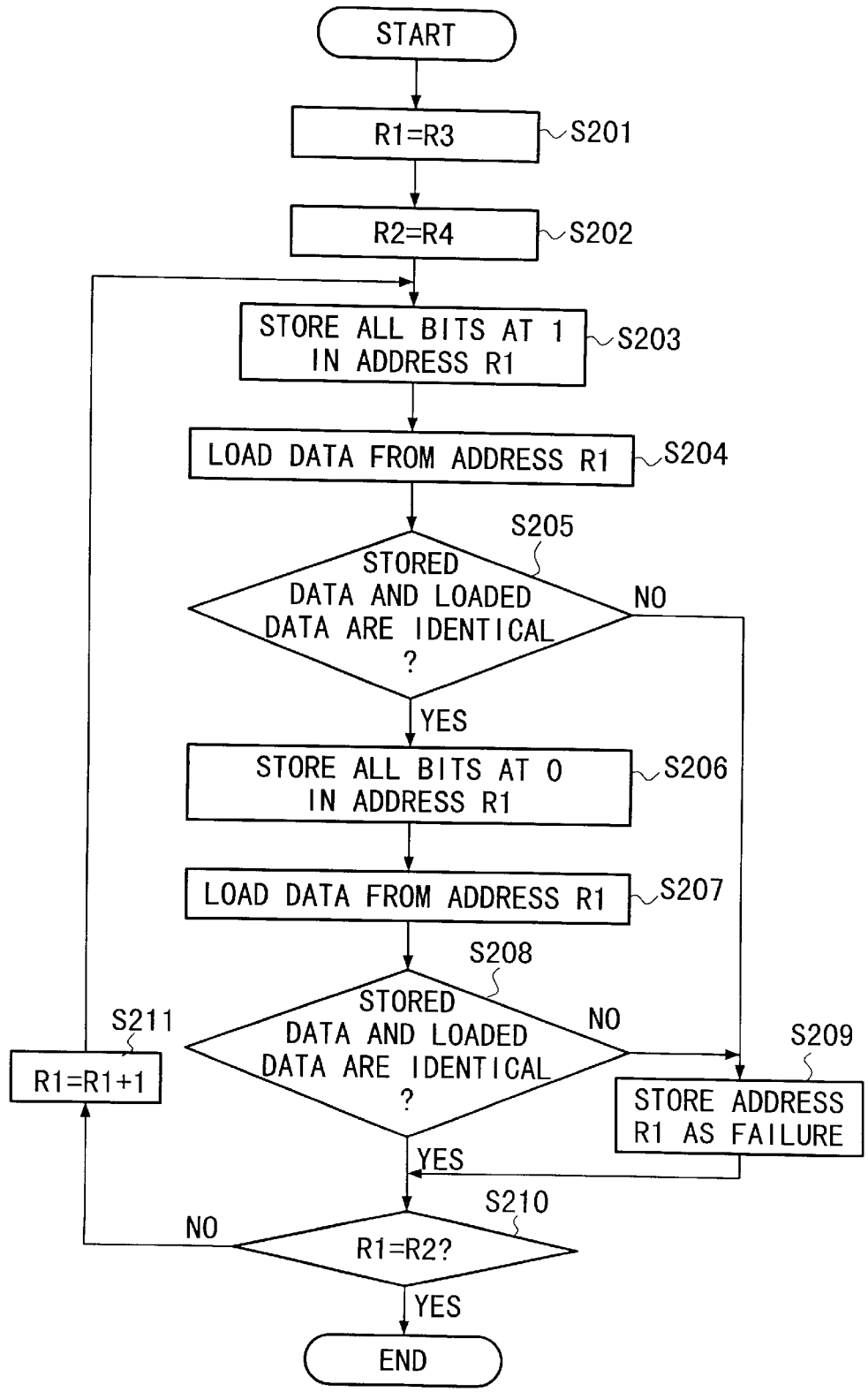
FIG. 3 is a flow chart showing the operation of the semiconductor device of the second embodiment of the present invention.

The failure diagnostic process with the second embodiment will be explained with reference to the flowchart of FIG. 3.

Before the failure diagnostic process, the setting of various registers (not shown) in the microprocessor 1 is performed. In the second embodiment, registers R1 and R2 are allocated as registers for storing variables, a register R3 defines the top address of the target address area of the failure diagnostic process, a register R4 defines the last address of the target address area. In the registers R3 and R4, the top and last addresses are written beforehand. The addresses in the registers R3 and R4 may be included in the failure compensation program stored in the ROM 4, or may be specified from the external device.

After the setting of the registers in the microprocessor 1, the following steps are carried out.

In step S201, the top address (i.e., "00") defined by the register R3 is set in the register R1.

In step S202, the last address (i.e., "F0") defined by the register R4 is set in the register R2.

In step S203, data of all bits set to "1" is stored (written) in the address area in the RAM 5 specified by the register R1 (hereinafter referred to as the "address area R1"). That is, the 8 bit data of all bits having a logic value 1 is written in the top address area in the RAM 5.

In step S204, the data is loaded from the address area R1 in the RAM 5. That is, the data written in the top address area in the RAM 5 is read out.

In step S205, the data, which was stored in the address area R1 in the RAM 5, is compared with the loaded data, and a determination is made whether they are identical or not.

In step S206, when the stored data and the loaded data are identical, the data of all bits set to "0" is stored in the address area R1 in the RAM 5. That is, the 8 bit data of all bits having a logic value 0 is written in the top address area in the RAM 5.

In step S207, the data is loaded from the address area R1 in the RAM 5. That is, the data written in the top address area in the RAM 5 is read out.

In step S208, the data, which was stored in the address area R1 in the RAM 5, is compared with the loaded data, and a determination is made whether they are identical or not.

In step S209, when in step S205 or step 208 the data which was stored in the address area R1 in the RAM 5 and the loaded data are not identical, the address set in the register R1 is stored in, for example, the register 7-1 in the failed address register group 7 as a failed address.

In step S210, it is determined whether the address in the register R1 is identical to the last address in the register R2.

In step S211, when the address in the register R1 is not identical to the last address in the register R2 (step S210: NO), the address in the register R1 is incremented by 1, and thus becomes the next to top address.

Then, the flow returns to step S203, the failure diagnostic process for the incremented address in the register R1 is repeated until the address in the register R1 becomes equal to the last address (step S210: YES), at which point the failure diagnostic process is completed.

According to the above process, the failure diagnostic process is performed for the address area corresponding to the top address in the register R3 to the last address in the register R4, to thereby detect the failed addresses in the area.

According to the second embodiment, only the address area for storing the application program (specified data) is subjected to the failure diagnostic process, and the remaining address area is excluded from the target of the process. The failure diagnostic process for the address area, which is not used for the application program, is omitted, thereby improving the efficiency of the failure diagnostic process.

Embodiment 3

The third embodiment of the present invention will now be explained.

While the second embodiment specifies the address area in the RAM 5 which is the target of the failure diagnostic process, the third embodiment uses the application program data (specified data), which is to be stored in the RAM 5, as the data for the failure diagnosis (hereinafter referred to as the test data). The third embodiment employs the structure shown in FIG. 1, and the microprocessor 1 performs the failure diagnostic process shown in FIG. 4 as step 2 shown in FIG. 2.

Figure 4:
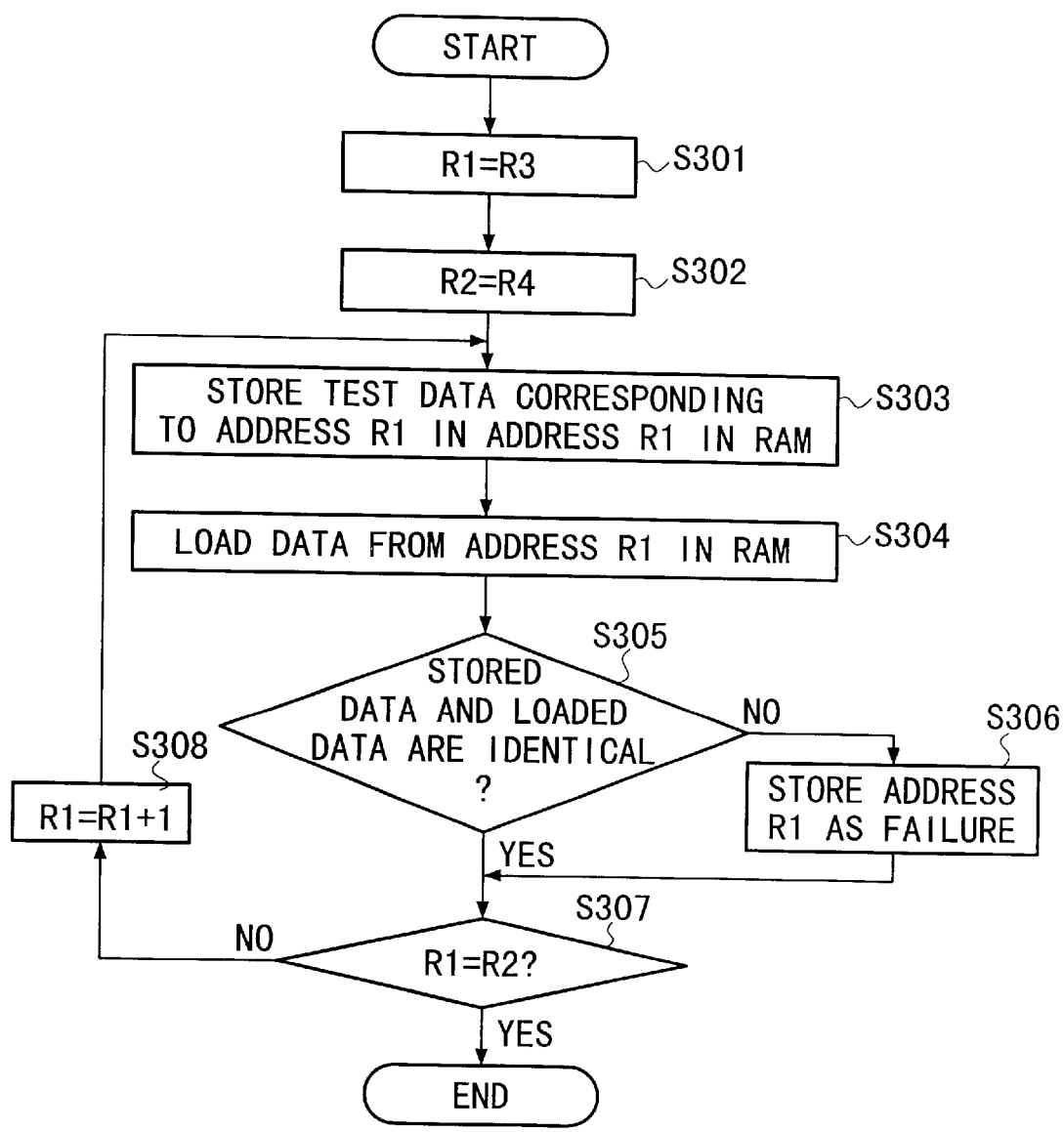
FIG. 4 is a flow chart showing the operation of the semiconductor device of the third embodiment of the present invention.

The failure diagnostic process of the third embodiment will be explained with reference to the flowchart of FIG. 4.

Before the failure diagnostic process, the setting of various registers (not shown) in the microprocessor 1 is performed in a manner similar to the second embodiment. Registers R1 and R2 are allocated as registers for storing variables, a register R3 defines the top address of the target address area of the failure diagnostic process, a register R4 defines the last address of the target address area. The register R3 stores the top address of the test data which is the application program to be stored in the RAM 5. The register R4 stores the last address in the register R4.

After the setting of the registers in the microprocessor 1, the following steps are carried out.

In step S301, the top address (i.e., "00") defined by the register R3 is set in the register R1.

In step S302, the last address (i.e., "F0") defined by the register R4 is set in the register R2.

In step S303, 8 bit data is stored in the address area in the RAM 5 specified by the register R1 (that is, the address area R1).

In step S304, the data is loaded from the address area R1 in the RAM 5.

In step S305, the data, which was stored in the address area R1 in the RAM 5, is compared with the loaded data, and a determination is made whether they are identical or not.

In step S306, when the data are not identical (step S305: NO), the address set in the register R1 is stored in, for example, the register 7-1 in the failed address register group 7 as a failed address. When the data are identical (step S305: YES), step S306 is skipped, and the flow proceeds to step S307.

In step S307, it is determined whether the address in the register R1 is identical to the last address in the register R2.

In step S211, when the address in the register R1 is not identical to the last address (step S307: NO), the address in the register R1 is incremented by 1, and thus becomes the next to top address.

Then, the flow returns to step S303, the failure diagnostic process for the incremented address in the register R1 is repeated until the address in the register R1 becomes equal to the last address (step S307: YES), at which point the failure diagnostic process is completed.

According to the above process, the failure diagnostic process is performed for the address area corresponding to the top address in the register R3 to the last address in the register R4, to thereby detect the failed addresses in the test data of the application program.

According to the third embodiment, the failure diagnostic process is performed for the test data which is the application program to be stored in the RAM 5. Only the failed addresses in the address area which stores the application program are detected, thereby improving the efficiency of the failure diagnostic process.

Embodiment 4

While the second embodiment performs the failure diagnostic process for the specified address area and substitutes the failed bit in the RAM 5 for the failure compensation register group 6, the semiconductor device of the fourth embodiment substitutes the failed bit in the RAM 5 for a normal (defect-free) bit in a spare address area in the RAM 5.

Figure 5:
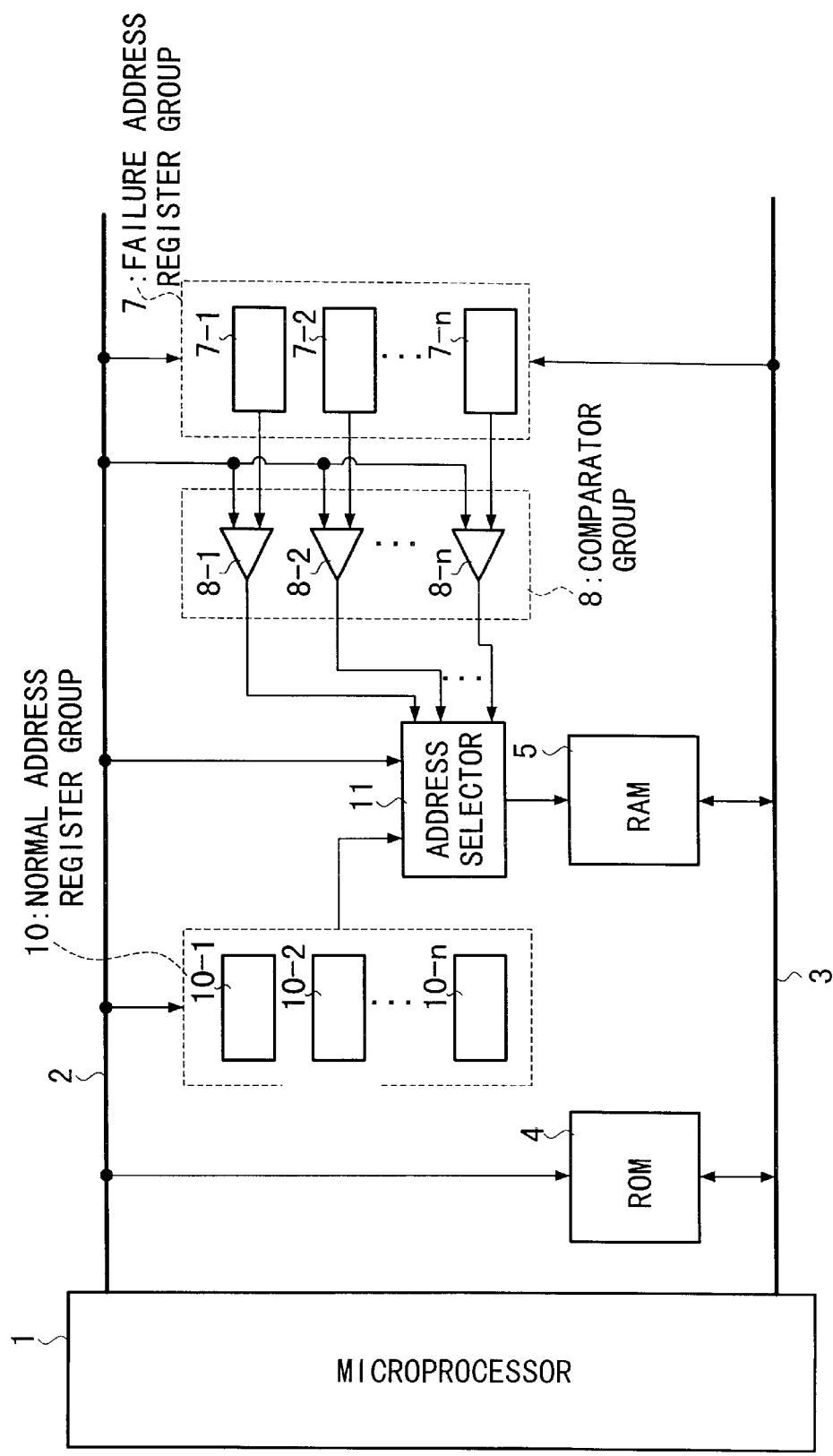
FIG. 5 is a block diagram showing the semiconductor device according to the fourth embodiment of the present invention.

As shown in FIG. 5, the fourth embodiment comprises: a normal address register group 10 for storing normal addresses specifying normal bits in the RAM 5; and an address selector circuit 11 for selecting one of the address sent from the microprocessor 1 and the address (normal address) stored in the normal address register group 10 and sending the selected address to the RAM 5.

Specifically, the input to the normal address register group 10 is connected to the address bus 2. One of the inputs to the address selector circuit 11 is connected to the output from the normal address register group 10, and the other is connected to the address bus 2. The address input to the RAM 5 is connected to the output from the address selector circuit 11. The data output from the RAM 5 is directly connected to the data bus 3. The normal address register group 10 comprises registers 10-1 to 10-n, which correspond to the registers 7-1 to 7-n, respectively.

In the following, the operation of compensating the failure by the semiconductor device of the fourth embodiment will be explained.

Referring to the flowchart of FIG. 2 for the second embodiment, the fourth embodiment further comprises steps for detecting a normal address (hereinafter referred to as "normal address detection steps") between steps S2 and S3. In the normal address detection steps, the address area, other than the target address area in step S2, i.e., the address area after the last address handled in the failure diagnostic process (hereinafter referred to as "spare address area"), undergoes the failure diagnostic process. The failed address, detected in the failure diagnostic process, is substituted for the normal address detected in normal address detection steps, to thereby compensate the failure. The failure diagnostic process in the fourth embodiment is similar to the second embodiment.

In the following, the normal address detection process (the detail of normal address detection steps) will be explained with reference to the flowchart of FIG. 6.

Before the normal address detection process, the setting of the registers (not shown) in the microprocessor 1 is performed. The register R3 defines the top address of the spare address area (i.e., the address area which is not used by the application program) which is excluded from the target of the failure diagnostic process in step S2. The register R4 defines the last address of the spare address area.

After the completion of the setting of the registers in the microprocessor 1, the following process is carried out.

In step S221, the top address of the spare address area defined by the register R3 is set in the register R1.

In step S222, the last address of the spare address area defined by the register R4 is set in the register R2.

In step S223, data of all bits set to "1" is stored in the address area in the RAM 5 specified by the register R1 (hereinafter referred to as the "address area R1").

In step S224, the data is loaded from the address area R1 in the RAM 5.

In step S225, the data, which was stored in the address area R1 in the RAM 5, is compared with the loaded data, and a determination is made whether they are identical or not.

In step S226, when the stored data and the loaded data are identical (step S225: YES), the data of all bits set to "0" is stored in the address area R1.

In step S227, the data is loaded from the address area R1 in the RAM 5.

In step S228, the data of all bits set to "0", which was stored in the address area R1 in the RAM 5, is compared with the loaded data, and a determination is made whether they are identical or not.

In step S229, when the data are identical (step S228: YES), the address set in the register R1 is detected as a normal address, and is stored in, for example, the register 10-1 in the normal address register group 10. When the data are not identical (step S228: NO), the normal address is not detected, and the flow proceeds to step S230.

In step S230, it is determined whether the address in the register R1 is identical to the last address of the spare address area in the register R2.

In step S231, when the address in the register R1 is not identical to the last address in the register R2 (step S230: NO), the address in the register R1 is incremented by 1, and thus becomes the next to top address. Then, the flow returns to step S223, the same process is repeated until the address in the register R1 becomes equal to the last address.

In step S232, when the data in the register R1 becomes equal to the last address (the data in the register R2) (step S230: YES), it is determined whether there are normal addresses or not.

In step S233, when there are no normal addresses (step S232: NO), that is, when the data in the register R1 is not stored in step S229, the microprocessor 1 indicates that the compensation of the failure is impossible (NG process), and the process is terminated. When there are normal addresses (step S232: YES), step S233 is skipped, and the process for detecting the normal address is terminated.

Thus, the normal address detection process is performed in addition to the failure diagnostic process. As the result, the failed address register group 7 stores the failed addresses in the address area for storing data, and the normal address register group 10 stores the normal addresses in the spare address area which does not store any data.

After the detection of the failed addresses and the normal addresses, when the address sent from the microprocessor 1 to the RAM 5 is identical to the address stored in, i.e., the register 7-1 in the failed address register group 7, the address selector circuit 11 selects the register 10-1 in the normal address register group 10 (corresponding to the register 7-1), and replaces the failed address in the register 7-1 with the normal address in the register 10-1. That is, the failed address in the RAM 5 specified by the register 7-1 is substituted for the normal spare address in the RAM 5 specified by the register 10-1, thus compensating the failure in the RAM 5.

According to the fourth embodiment, only the area in the RAM 5 which stores the application program undergoes the failure diagnostic process, and failed bits are compensated by the normal bit in the spare address area. Therefore, registers, other than the RAM 5 for compensating the failures are not necessary, and the spare address area is efficiently utilized to compensate the failures.

While the fourth embodiment performs the failure diagnostic process in a manner similar to the second embodiment, the failure diagnostic process uses the application program, which is to be stored in the RAM5, as test data in a manner similar to the third embodiment.

Although the present invention is described in detail by way of the first to fourth embodiments, the invention is not limited to this, and modifications, such as simple design changes which fall within the scope of the invention, are included in this invention. For instance, while in the above embodiments 8 bit data specified by the address is compensated, the compensation may be carried out on a bit-by-bit basis.

In this modification, the failed address register group 7 stores information specifying the position of the failed bit in the 8 bit data, as well as the failed address. Each register in the failure compensation register group stores one bit data, and the selector circuit 9 selects one bit in the 8 bit data in the RAM 5, and replaces it with the register in the failure compensation register group 6.

Although the above embodiments compensate failures in the RAM 5, this invention can be applied to other types of memories.

While the above embodiments store the failure detection program in the ROM 4, the program may be loaded from the external device, when executing the failure diagnostic process and the normal address detection process.

While the above embodiments execute the failure compensation process in response to the reset signal from the system, the application program may include the data which is a trigger to start the failure compensation process and the data specifying the address area, and may automatically start the failure compensation process when loading the application program.

While in the above embodiments the failure compensation circuit comprises the failure compensation register group 6, the failed address register group 7, the comparator group 8, the selector circuit 9, the normal address register group 10, and the address selector circuit 11, separately from the microprocessor 1, the operations of these elements may be achieved by software as a function of the microprocessor 1.

While the above embodiments compensate failed bits on an address basis, the failed address register group 7 may store the addresses, which includes the failed address, on an address area basis. In this modification, the failure compensation register group 6 has the data storage area corresponding to the address area to be compensated.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. A semiconductor device with a memory, comprising:
   a failure diagnostic device for diagnosing said memory to detect a failed address; and
   a failed bit compensation device for compensating a failed bit in said memory which is specified by the failed address, based on the diagnostic result by said failure diagnostic device,
   wherein said failure diagnostic device diagnoses said memory for address failures only within the address area required for specified data to be stored in said memory, and diagnoses said memory for a normal address outside said address area, and said failed bit compensation device substitutes the failed address for the normal address.

2. A semiconductor device according to claim 1, wherein said failure diagnostic device diagnoses said memory using specified data to be stored in said memory.

3. A semiconductor device according to claim 1, wherein said failed bit compensation device comprises:
   a register group for substituting the failed bit;
   a failed address storage devise for storing the failed address detected by said failure diagnostic devise;
   an address coincidence detection device for detecting the coincidence between the failed address stored in said failed address storage device and the address sent to said memory; and
   a selector for connecting one of said memory and said register group to a data bus, based on the detection result by the said address coincidence detection device.

4. A method for compensating a failure in a semiconductor device with a memory, comprising the steps of:
   failure diagnostic step of diagnosing said memory to detect a failed address; and
   failed bit compensation step of compensating a failed bit in said memory which is specified by the failed address, based on the diagnostic result in failure diagnostic step,
   wherein, in the failure diagnostic step, the diagnosis of said memory is made to detect a failed address only within the address area required for specified data to be stored in said memory, and a diagnoses of said memory area outside the address area is made to detect a normal address, and
   wherein said failed bit compensation step includes substituting said failed address for said normal address.

5. A method according to claim 4, wherein, in the failure diagnostic step, the diagnosis of the memory is made using specified data to be stored in said memory.

6. A method according to claim 4, wherein the failed bit compensation step comprises the steps of:
   a) storing the failed address detected in the failure diagnostic step;
   b) detecting the coincidence between the failed address and the address sent to said memory; and
   c) selecting one of said memory and a register group substituting the failed bit for connection to a data bus when the coincidence between the failed address and the address sent to said memory is detected.

7. A semiconductor device according to claim 2, wherein said failure diagnostic device diagnoses said memory outside the address area for specified data to be stored in said memory, and detects a normal address, and
   said failed bit compensation device substitutes the failed address for the normal address.

8. A semiconductor device according to claim 2, wherein said failed bit compensation device comprises:
   a register group for substituting the failed bit;
   a failed address storage device for storing the failed address detected by said failure diagnostic device;
   an address coincidence detection device for detecting the coincidence between the failed address stored in said failed address storage device and the address sent to said memory; and
   a selector for selecting one of said memory and said register group to a data bus, based on the detection result by the said address coincidence detection device.

9. A semiconductor device according to claim 1, wherein said failed bit compensation device comprises:
   a register group for substituting the failed bit;
   a failed address storage device for storing the failed address detected by said failure diagnostic device;
   an address coincidence detection device for detecting the coincidence between the failed address stored in said failed address storage device and the address sent to said memory; and
   a selector for connecting one of said memory and said register group to a data bus, based on the detection result by said address coincidence detection device.

10. A semiconductor device according to claim 7, wherein said failed bit compensation device comprises:
    a register group for substituting the failed bit;

a failed address storage device for storing the failed address detected by said failure diagnostic device;

an address coincidence detection device for detecting the coincidence between the failed address stored in said failed address storage device and the address sent to said memory; and a selector for connecting one of said memory and said register group to a data bus, based on the detection result by the said address coincidence detection device.

11. A method according to claim 5, wherein, in the failure diagnostic step, the diagnosis of said memory is made outside the address area for specified data, which is to be stored in said memory, to detect a normal address, and in the failed bit compensation step, the failed address is substituted for the normal address.

12. A method according to claim 5, wherein the failed bit compensation step comprises the steps of:

a) storing the failed address detected in the failure diagnostic step;

b) detecting the coincidence between the failed address and the address sent to said memory; and c) selecting one of said memory and a register group for connection to a data bus when the coincidence between the failed address and the address sent to said memory is detected.

13. A method according to claim 4, wherein the failed bit compensation step comprises the steps of:

a) storing the failed address detected in the failure diagnostic step;

b) detecting the coincidence between the failed address and the address sent to said memory; and c) selecting one of said memory and a register group for connection to a data bus when the coincidence between the failed address and the address sent to said memory is detected.

14. A method according to claim 11, wherein the failed bit compensation step comprises the steps of:

a) storing the failed address detected in the failure diagnostic step;

b) detecting the coincidence between the failed address and the address sent to said memory; and c) selecting one of said memory and a register group for connection to a data bus when the coincidence between the failed address and the address sent to said memory is detected.

* * * * *